United States Patent
Hiraide (10) Patent No.: US 8,081,528 B2
(45) Date of Patent: Dec. 20, 2011

(54) INTEGRATED CIRCUIT AND METHOD FOR TESTING THE CIRCUIT

(75) Inventor: Takahisa Hiraide, Shinjuku (JP)

(73) Assignee: Fujitsu Semiconductor Limited, Yokohama (JP)

(*) Notice: Subject to any disclaimer, the term of this patent is extended or adjusted under 35 U.S.C. 154(b) by 234 days.

(21) Appl. No.: 12/482,254

(22) Filed: Jun. 10, 2009

(65) Prior Publication Data

US 2009/0245001 A1    Oct. 1, 2009

(30) Foreign Application Priority Data

Jan. 8, 2008   (JP) ................. 2008-200094

(51) Int. Cl.
*G11C 7/00*   (2006.01)
(52) U.S. Cl. .................. 365/200; 365/230.03
(58) Field of Classification Search ............. 365/200, 365/230.03
See application file for complete search history.

(56) References Cited

U.S. PATENT DOCUMENTS

| | | | |
|---|---|---|---|
| 6,246,618 B1 * | 6/2001 | Yamamoto et al. ......... 365/200 |
| 6,263,082 B1 | 7/2001 | Ishimoto et al. | |
| 6,754,345 B2 | 6/2004 | Ishimoto et al. | |
| 2002/0170003 A1 | 11/2002 | Hirabayashi | |
| 2004/0117696 A1 | 6/2004 | Ito | |
| 2004/0246801 A1 | 12/2004 | Lee et al. | |
| 2006/0005095 A1 | 1/2006 | Ichikawa | |

FOREIGN PATENT DOCUMENTS

| | | |
|---|---|---|
| JP | 10-207695 A | 8/1998 |
| JP | 2000-222899 A | 8/2000 |
| JP | 2002-298598 A | 10/2002 |
| JP | 2003-132696 A | 5/2003 |

* cited by examiner

*Primary Examiner* — Hoai V Ho
*Assistant Examiner* — Jason Lappas
(74) *Attorney, Agent, or Firm* — Arent Fox, LLP (57) ABSTRACT

An integrated circuit includes a memory; a memory test circuit that tests the memory; and an input/output port, wherein the memory test circuit includes a latch circuit that outputs output of the memory, an address of the memory to be accessed is changed in accordance with a first clock signal, and output of the memory corresponding to the changed address is latched in accordance with a latch signal having a cycle of an integral multiple of the first clock signal, data of the latch circuit is output via the input/output port in a cycle of the latch signal, an address of a memory cell corresponding to the output of the memory to be latched by the latch circuit is changed, and the latch and the output is repeated.

13 Claims, 11 Drawing Sheets

INTEGRATED CIRCUIT AND METHOD FOR TESTING THE CIRCUIT

CROSS-REFERENCE TO RELATED APPLICATIONS

This application claims the benefit of priority from Japanese Patent Application No. 2008-200094 filed on Aug. 1, 2008, the entire contents of which are incorporated herein by reference.

BACKGROUND

1. Field

The embodiments discussed herein are directed to an integrated circuit.

2. Description of the Related Art

A static random access memory (SRAM), a dynamic random access memory (DRAM), or the like is embedded in an integrated circuit in a computer system, such as, for example, a System on Chip (SoC), a processor, a digital signal processor (DSP), or a memory element. As the SoC is increasingly sophisticated, the capacity of the embedded memory is also increased. Then, the yield rate is determined by the quality of the embedded memory. Accordingly, a test circuit for automatically testing the embedded memory is embedded in the SoC.

The test of the memory embedded in the SoC has been disclosed, for example, in Japanese Laid-open Patent Application No. 2002-298598, Japanese Laid-Open Patent Application No. 2000-222899, Japanese Laid-Open Patent Application No. 2003-132696, and Japanese Laid-Open Patent Application No. H10-207695.

SUMMARY

According to aspects of embodiments, an integrated circuit is provided which includes a memory; a memory test circuit that tests the memory; and an input/output port, wherein the memory test circuit includes a latch circuit that outputs output of the memory, an address of the memory to be accessed is changed in accordance with a first clock, and output of the memory corresponding to the changed address is latched in accordance with a latch signal having a cycle of an integral multiple of the first clock, data of the latch circuit is output via the input/output port in a cycle of the latch signal, an address of a memory cell corresponding to the output of the memory to be latched by the latch circuit is changed, and the latch and the output is repeated.

Additional advantages and novel features of the invention will be set forth in part in the description that follows, and in part will become more apparent to those skilled in the art upon examination of the following or upon learning by practice of the invention.

DESCRIPTION OF THE EMBODIMENTS

Figure 1:
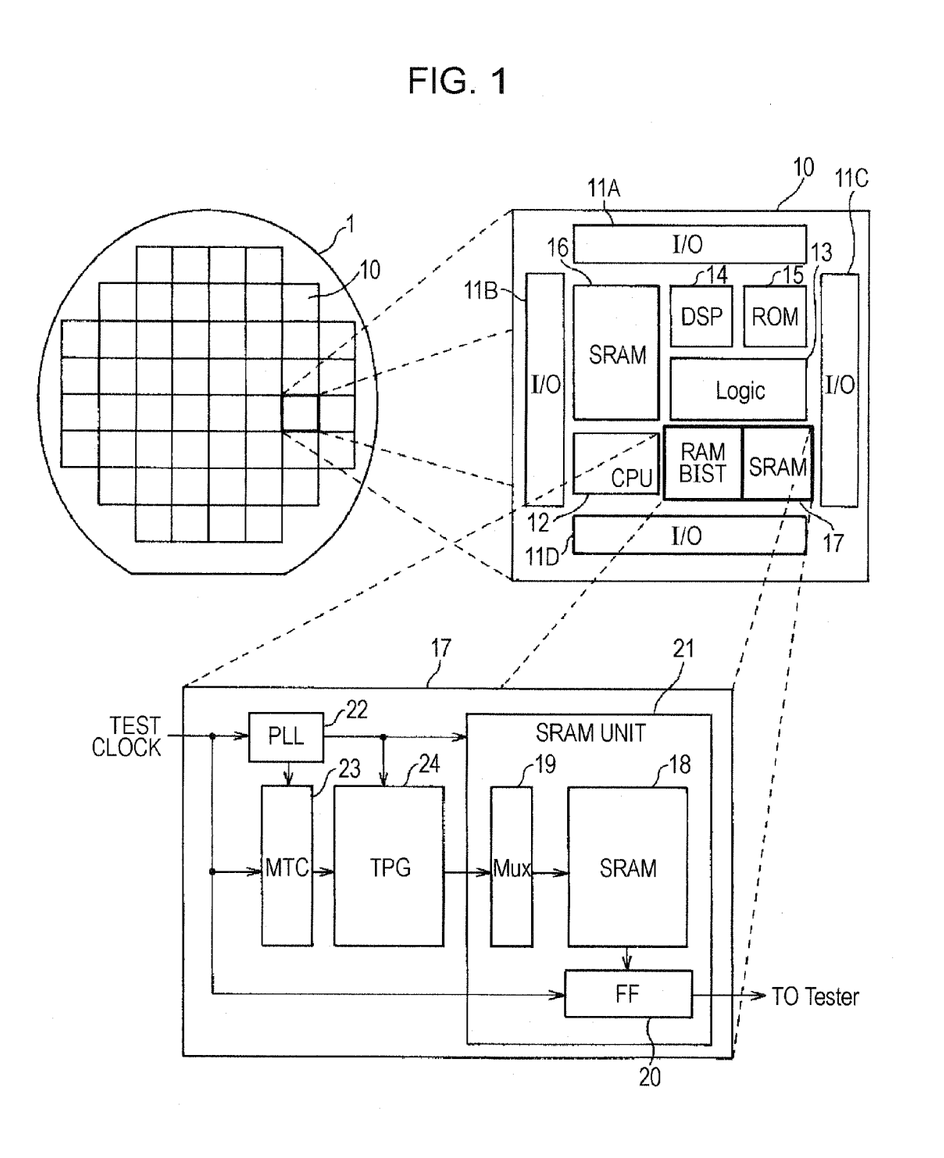
FIG. 1 illustrates an exemplary integrated circuit (SoC).

FIG. 1 illustrates an exemplary integrated circuit (SoC). As illustrated in FIG. 1, a wafer 1 includes a plurality of chips SoCs 10. Each SoC 10 includes input/output (I/O) ports 11A to 11D, a central processing unit (CPU) 12, a logic circuit (Logic) 13, a DSP 14, a read-only memory (ROM) 15, a SRAM 16, and a memory 17. The memory 17 is accessed by the CPU 12, the logic circuit 13, the DSP 14, or the like, and may not be directly accessed from the outside. The memory 17 may be an SRAM.

The memory 17 includes an SRAM unit 21 that has the SRAM 18, and a RAM Built-In Self Test (RAM-BIST) circuit for performing a test of the SRAM 18. The SRAM unit 21 includes a multiplexer Mux 19 and a latch circuit (FF) 20. The multiplexer Mux 19 switches from/to access from the RAM-BIST circuit to the SRAM 18 in testing to/from access from a part other than the RAM-BIST circuit in the SoC 10, for example, the CPU 12, the logic circuit 13, the DSP 14, or the like in normal operation. The latch circuit (FF) 20 latches output of the SRAM 18 in the testing. The latch circuit 20 includes two flip-flops. When one of the two flip-flops is written "1" after being reset to "0", that flip-flop holds "1" even if "0" is written. That is, once "1" is written to one of the two flip-flops, the value of that flip-flop may not return to "0" as long as it is not reset. When the other one of the two flip-flops is written "0" after being reset to "1", it holds "0" even if "1" is written. That is, once "0" is written to the other one of the two flip-flops, its value may not return to "1" as long as it is not reset. When a result of comparison between written data and read data is stored, one flip-flop may be provided.

The RAM-BIST circuit includes a phase-locked loop (PLL) circuit 22, a memory test controller (MTC) 23 and a test pattern generation circuit (TPG) 24. The PLL circuit 22 generates a first clock that has a high speed close to a clock in normal operation based on a test clock or clock signal supplied to the memory 17 in the testing. The test clock may be supplied as the high-speed first clock without providing the PLL circuit 22.

Figure 2A:
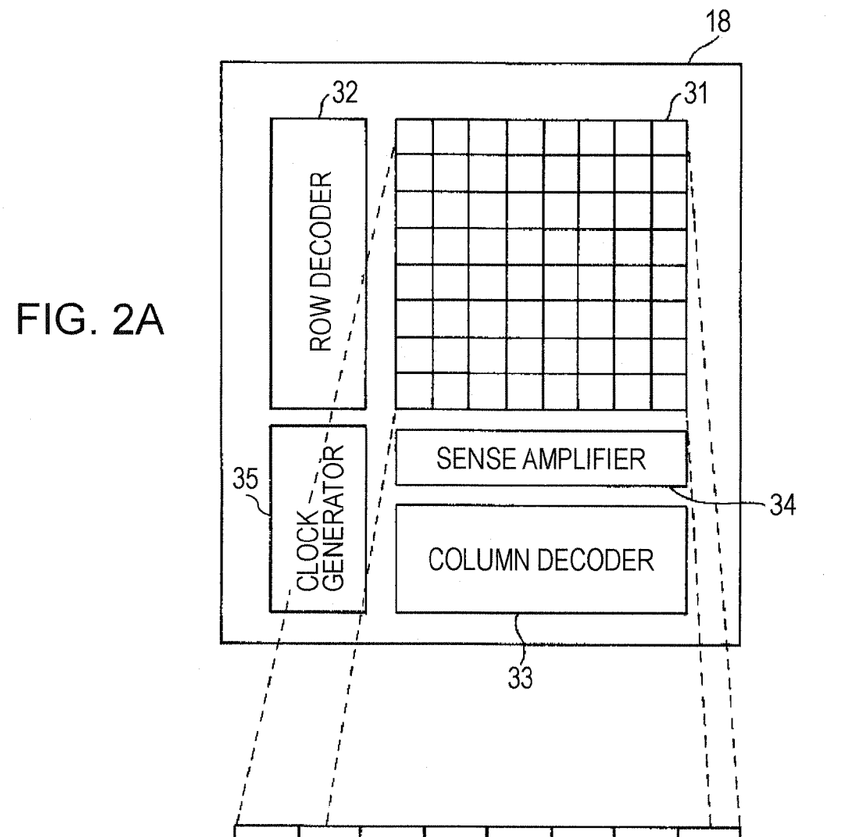
FIG. 2A and FIG. 2B illustrate an exemplary SRAM and an exemplary fail bit map (FBM).

FIG. 2A illustrates an exemplary SRAM. The SRAM may be SRAM 18 in FIG. 1. The SRAM 18 includes a cell array 31, a row decoder 32, a column decoder 33, a sense amplifier 34 and a clock generator 35.

Figures 3A, 3B:
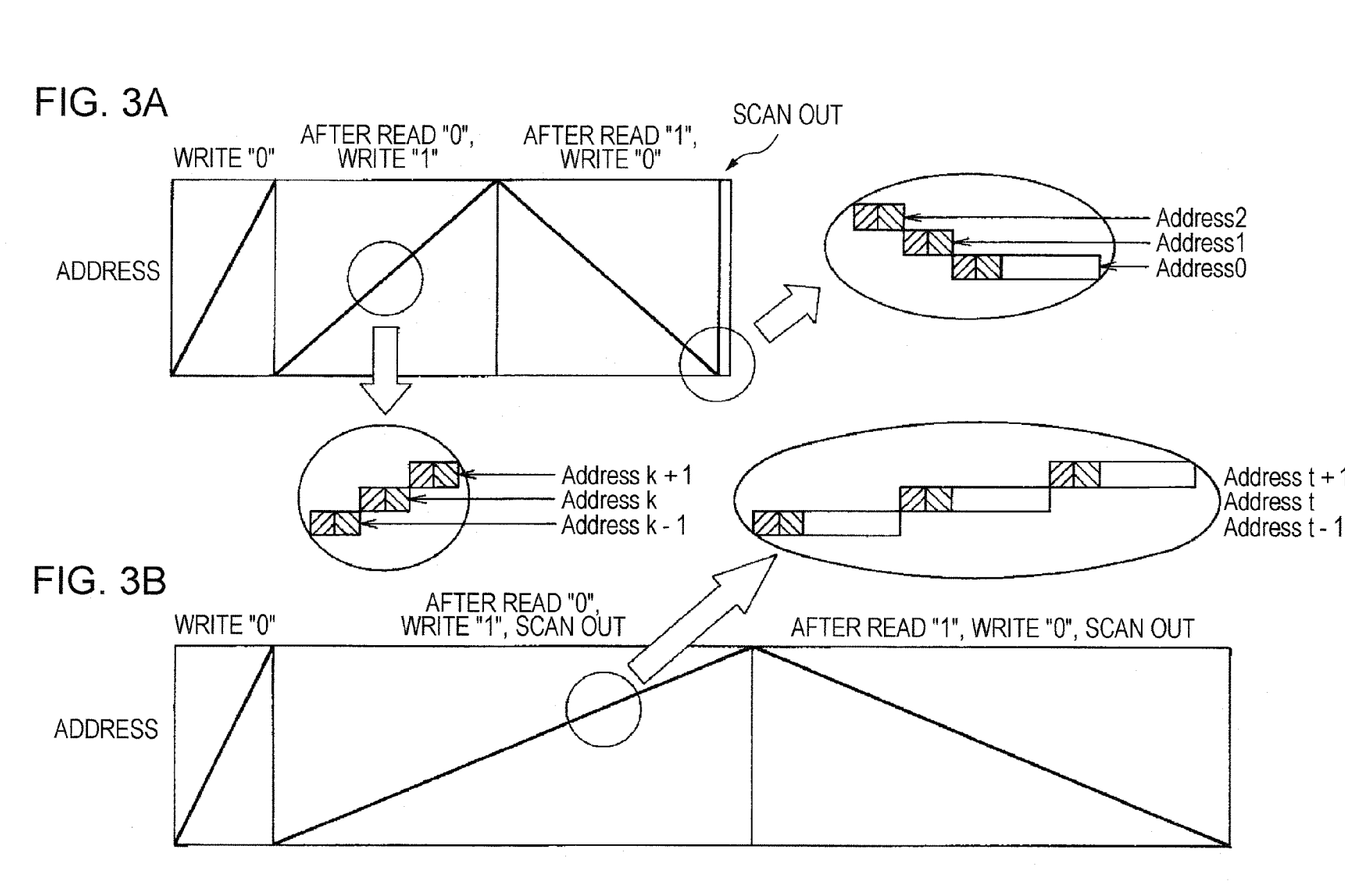
FIG. 3A and FIG. 3B illustrate an exemplary test for a SRAM.

An incorporation test includes a quality determination test for selecting a faulty chip and a test for specifying a failure cause. In the quality determination test, whether a SoC normally operates or not, for example, whether data is normally written in the memory 17 and the data is normally read from the memory 17 is tested. In a test using a test pattern, for example, as illustrated in FIG. 3A, after the two flip-flops in the FF 20 are reset, an address is sequentially changed, and "0" is written in the memory. Then, while the address is sequentially changed, data read from the memory is stored in one of the two flip-flops and "1" is written in the memory. Further, after the address is changed in a forward direction or an opposite direction, data read from the memory is stored in the other flip-flop of the two flip-flops, and "0" is written in the memory. Finally, the data stored in the two flip-flops in the FF 20 is read (scan-out operation). When no faulty cell exists in the SRAM 18, "0" is read from one of the two flip-flops in the FF 20 and "1" is read from the other flip-flop. When a faulty cell exists in the SRAM 18, "1" is read from one of the two flip-flops in the FF 20, or "0" is read from the other flip-flop. However, the quality determination test may not specify the address of the faulty cell.

In the scan-out operation, the data held in the FF 20 is output to the outside of the SoC 10. The access speed to the SRAM 18 in the SoC 10 is slow due to an interface signal for an external tester. For example, when the output of the SRAM 18 is N-bits, the N-bit data is converted into serial data and output from one terminal without providing I/O ports for the N-bit data. Even if an output cycle of the FF 20 is substantially the same as the operation cycle of the SRAM, scan-out operation time may be more than N times the operation cycle of the SRAM. If the output cycle of the FF 20 is K times the operation cycle of the SRAM, the scan-out operation time may be more than K×N times the operation cycle of the SRAM. If data of the two flip-flops is output, the scan-out operation time is doubled.

In the SRAM, redundant cells of a plurality of rows or columns are provided, and replacement of a row or a column containing a faulty cell is performed. A latch circuit similar to the above-described latch circuit may be provided for each row or column, and a test for detecting a row or a column containing a faulty cell may be performed. However, detecting how many faulty cells exist in the detected row or column may not be performed, and the address of the faulty cell may not be detected.

Figure 2B:
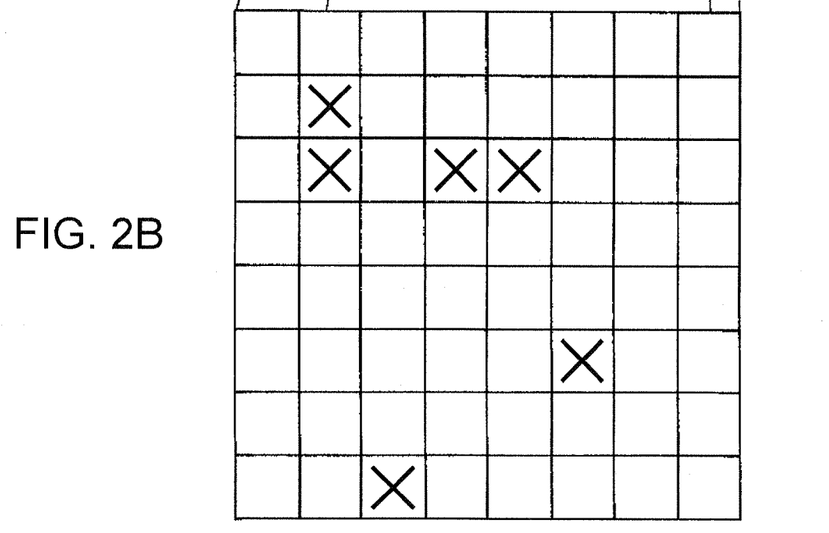

In a test to specify a failure cause, in order to specify a faulty point in a memory, a Fail Bit Map (FBM) acquisition test is performed. In the FBM acquisition test, an address of a faulty cell is acquired in a map format. FIG. 2B illustrates an exemplary FBM. In FIG. 2B, X marks indicate faulty cells.

In the FBM acquisition test, the RAM-BIST circuit embedded in the SoC for the quality determination test is used. The FF 20 holds output of one cell. Accordingly, as illustrated in FIG. 3B, every time access to each cell in the SRAM 18 is performed, the scan-out operation is performed. Since the scan-out operation is slower than the access operation to the SRAM 18 the access operation including reading, writing, and scan-out to one cell becomes slow.

In the quality determination test, to reduce test time or to guarantee system operation in an actual operation state, the test is implemented at an actual operation speed (actual time operation test). The operation at the actual operation speed is referred to as at-speed operation. Because of strict timing design and increase on the operation speed, process merging is small. Since the quality determination test of the SRAM 18 includes the scan-out operation, the test is performed at the actual operation speed and the FBM acquisition test is performed at a low speed. Accordingly, test results of the quality determination test and the FBM acquisition test may differ from each other. Since the scan-out operation is performed for each cell in the FBM acquisition test, the reading and writing operation is performed at a low speed. Accordingly, in the FBM acquisition test, failure that occurs when the writing and writing operation is successively performed at a high speed but does not occur at a low speed may not be detected.

Figure 4:
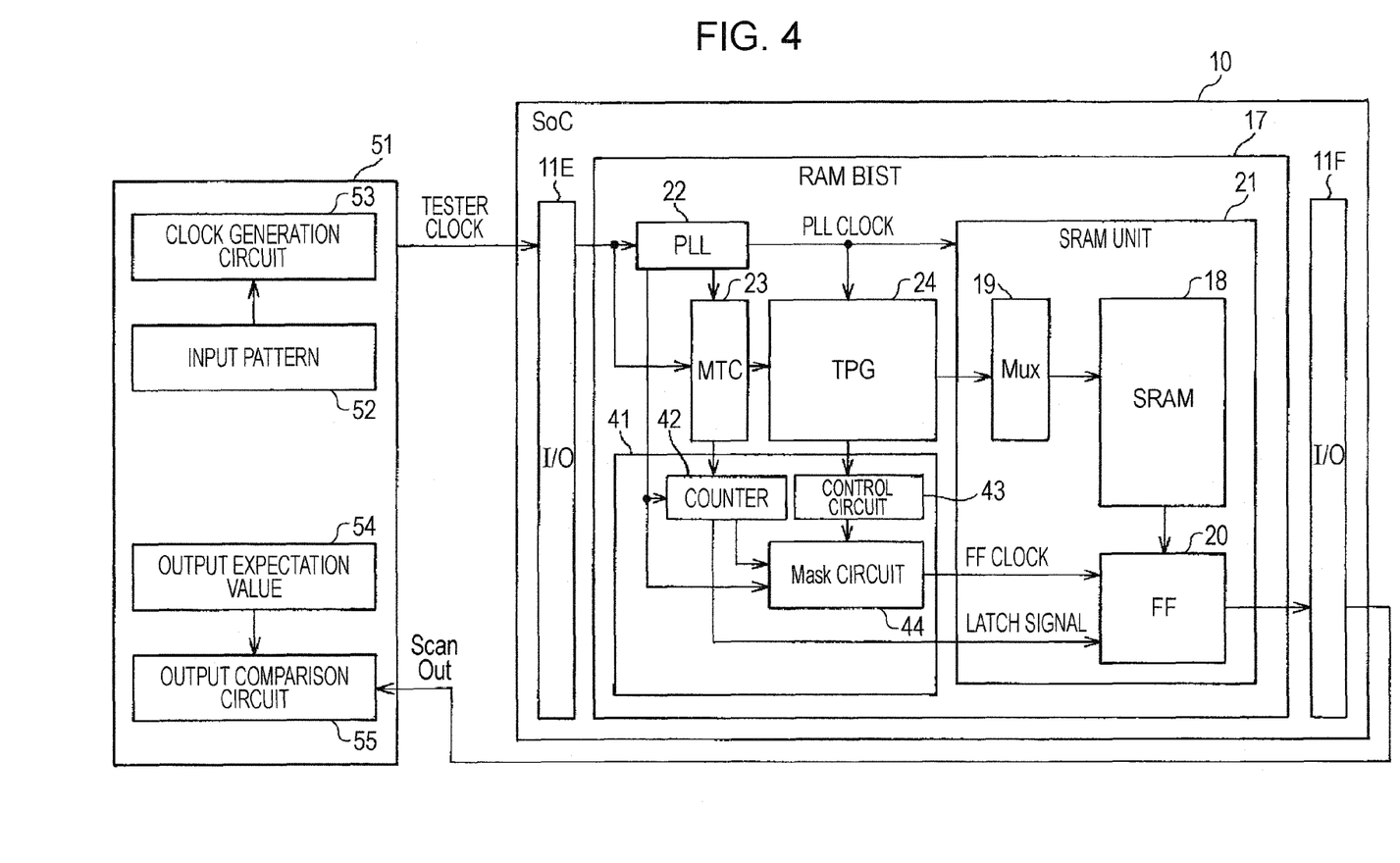
FIG. 4 illustrates a first embodiment.

FIG. 4 illustrates a first embodiment. FIG. 4 illustrates a test system in which a tester 51 that performs the FBM acquisition test of the integrated circuit 10 is coupled to the integrated circuit 10. The integrated circuit 10 may be an SoC having a computer system. The integrated circuit 10 includes the memory 17 and the I/O ports 11E and 11F. The memory 17 includes the SRAM unit 21 having the SRAM 18, and the RAM-BIST circuit for performing the test of the SRAM 18. The I/O port 11E receives a tester clock input from the tester 51 into the memory 17. The I/O port 11F outputs test output of the memory 17 to the outside. The test output of the memory 17 to the outside is input in the tester 51 as a Scan Out signal. The SRAM 18 includes an N-bit output. The N-bit data latched in the FF 20 is converted into serial data and output from the I/O port 11F. The integrated circuit 10 in the first embodiment includes a CPU, a logical circuit, a DSP, or the like (not shown). The SRAM 18 is accessed from the CPU, the logical circuit, the DSP, or the like (not shown).

The memory 17 includes the SRAM unit 21 having the SRAM 18, and the RAM-BIST circuit for performing the test of the SRAM 18. The SRAM unit 21 includes the multiplexer Mux 19 and the latch circuit (FF) 20. The multiplexer Mux 19 switches between access from the RAM-BIST circuit to the SRAM 18 in testing and access from a part other than the RAM-BIST circuit in the SoC 10, for example, the CPU, the logic circuit, the DSP or the like to the SRAM 18 in normal operation. The latch circuit (FF) 20 includes flip-flops that latch and hold output of the SRAM 18 in testing. The memory 17 includes the SRAM 18. However, it is not limited to the configuration, but the memory 17 may include, for example, a DRAM.

The FF 20 includes two flip-flops for each output bit of the SRAM 18. Since the SRAM 18 includes the N-bit output, the FF 20 includes the flip-flops of 2N pieces. Data from the flip-flops of N pieces is serial-converted and output. When "1" is written" to one of the two flip-flops after being reset to "0", the one flip-flop holds "1" even if "0" is written. Once "1" is written in the one flip-flop, "0" is not written in the one flip-flop as long as the one flip-flop is not reset. When "0" is written to the other one of the two flip-flops after being reset to "1", the other flip-flop holds "0" even if "1" is written. Once "0" is written in the other flip-flop, "1" is not written in the other flip-flop as long as the other flip-flop is not reset. By using a flip-flop such a FF 20, the quality determination test is performed. The data held in one of the two flip-flops is indicated as R0, and the data held in the other flip-flop is indicated as R1. The data indicated by the R0 and the R1 has N-bits respectively, and the data is serial-converted and output. The data indicated by the R0 and the R1 is not contemporaneously read. Accordingly, the terminal of the I/O port 11F may be one.

The RAM-BIST circuit includes the PLL circuit 22, the memory test controller (MTC) 23, the test pattern generation circuit (TPG) 24, and a latch control circuit 41. The PLL circuit 22 generates a first click that has a high speed close to a clock speed in normal operation based on a test clock supplied to the memory 17 in testing. For example, a cycle of the test clock is four times of that of a PLL clock.

The latch control circuit 41 generates a latch signal indicating timing for the FF 20 to latch the output of the SRAM 18 and an FF clock for the FF 20 to shift to read the data latched by the FF when writing and reading operations similar to those in the quality determination test illustrated in FIG. 3A are being performed on the SRAM 18. The latch control circuit 41 includes a counter 42 that counts the PLL clock under control of the MTC 23 and generates a signal corresponding to the count value, a control circuit 43 that generates a control signal for latching based on a signal of the TPG 24, and a Mask circuit 44 that generates the FF clock based on the signals from the counter 42 and the control circuit 43. The counter 42 generates the latch signal.

The tester 51 includes an input pattern memory 52, a clock generation circuit 53, an output expectation value register 54, and an output comparison circuit 55. The input pattern memory 52 stores a pattern of a test clock supplied to the SoC 10 for a test. The clock generation circuit 53 generates a tester clock according to an instruction from the input pattern memory 52. The output expectation value register 54 stores data that is expected to be output by the SRAM 18 based on operation of the SoC 10. The output comparison circuit 55 compares a Scan Out signal output from the SoC 10 with an expectation value output from the output expectation value register 54. When the Scan Out signal corresponds to the expectation value, the cell is determined to be normal, and when the Scan Out signal and the expectation value do not correspond to each other, the cell is determined to be a faulty cell. Since a test sequence of the SoC 10 is stored in the input pattern memory 52, the tester 51 may identify from which cell the Scan Out signal is output.

Figure 5:
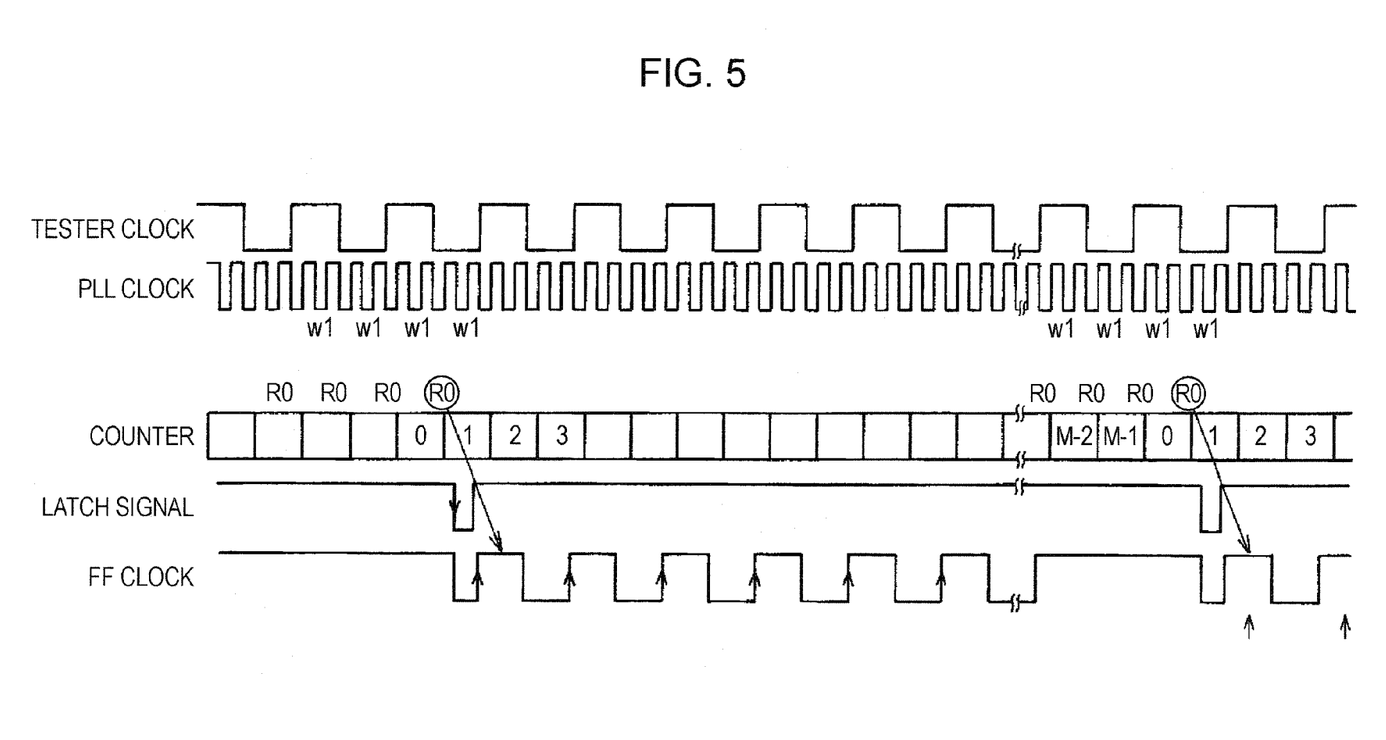
FIG. 5 illustrates an exemplary time chart of an FBM acquisition test sequence.

FIG. 5 illustrates an exemplary time chart of an FBM acquisition test sequence. The cycle of the tester clock is four times that of the PLL clock, and data from the FF 20 is read in synchronization with the tester clock. The PLL circuit 22 generates a PLL clock having a ¼ cycle of the tester clock, and supplies the PLL clock to the SRAM 21. The PLL clock having the ¼ cycle of the tester clock is supplied, for example, to the SRAM 18. The SRAM 18 operates in response to the PLL clock, and performs the operation illustrated in FIG. 3A. In a first operation, "0" is written. In a second operation, the written data is read and "1" is written. In a third operation, the written data is read and "0" is written. In the operation, scan-out operation is not performed. Then, a first cycle ends. A cycle in which the second operation and the third operation are performed is repeated for a given number of times. In the second operation and the third operation, a read operation and a write operation are performed on one cell corresponding to one address in two PLL clocks.

The counter 42 changes a count value in a ½ cycle of the tester clock and repeats counting of values from zero to M−1.

In FIG. 5, the read operation from the SRAM 18 and the write operation in the SRAM 18 are performed in synchronization with a falling of the PLL clock.

In the second operation in the first cycle, the MTC 23 sets the count value of the counter 42 to "0" when data is read from a cell corresponding to a start address of the SRAM 18, Address 0. When a ½ PLL clock has passed from the data being read, that is, in synchronization with a rising of the PLL clock, the MTC 23 sets the count value of the counter 42 to "1". After the count value is changed to "1", the counter 42 generates a latch signal in synchronization with a falling of the PLL clock. In response to the latch signal, N-bit data read from the SRAM 18 is latched by the FF 20.

After the latch signal is generated, the Mask circuit 44 outputs an FF clock. The FF clock is a N-pulse signal synchronized with the tester clock. Using a flip-flop of R0 data, the FF 20 shifts the latched N-bit data in synchronization with a rising of the FF clock and outputs the data to the I/O port 11F. The output comparison circuit 55 in the tester 51 strobes the output Scan Out and compares the output Scan Out with an output expectation value. For example, when the count value is "1", "3", or "5", the FF 20 performs the shift, and when the count value is "1", "3", or "5", the output comparison circuit 55 performs the strobe. Preferably, the maximum count value M−1 of the counter 42 is 2N+1 or more.

The Mask circuit 44 resets the FF 20 when the count value is changed from M−1 to zero.

The above-described operation is repeated in the second operation. From cells corresponding to addresses Address 0+M, Address 0+2M, . . . that are generated by increasing an address corresponding to Address 0 by M, data corresponding to "0" written in the first operation is read. When the read data is "0", the cell may be normal. When the read data is "1", the cell may be faulty. Since the tester 51 identifies the address of the read data, the tester 51 determines whether the cell corresponding to the address is normal or faulty and stores the result.

When the second operation ends and a read operation from a cell corresponding to a final address and a write operation in which "1" is written to the cell ends, the third operation is started. The count value is set from M−1 to "0", and the FF 20 is reset. When the data is read from the cell corresponding to the final address of the SRAM 18, the MTC 23 sets the count value of the counter 42 to "0". After the data is read, when ½ PLL clock has passed from the data being read, for example, in synchronization with a rising of the PLL clock, the MTC 23 sets the count value of the counter 42 to "1". In the third operation, a flip-flop corresponding to R1 of the FF 20 is used.

While the values of the addresses are changed in the opposite direction, operation substantially similar to the second operation is performed. From cells corresponding to the addresses reduced by M from the maximum address, data corresponding to "1" written in the second operation is read. When the read data is "1", the cell may be normal. When the read data is "0", the cell may be faulty. Since the tester 51 identifies the address of the read data, the tester 51 determines whether the cell corresponding to the address is normal or faulty and stores the result.

When the third operation ends and a read operation from the cell corresponding to the first address and a write operation in which "0" is written to the cell ends, the first cycle ends and the second cycle is started. In the second cycle, the second operation is started. The count value is set from M−1 to "0", and the FF 20 is reset. When data is read from a cell corresponding to the next address of the start address of the SRAM 18, that is, Address 1, the MTC 23 sets the count value of the counter 42 to "0". When the ½ PLL clock has passed after the data being read, for example, in synchronization with a rising of the PLL clock, the MTC 23 sets the count value of the counter 42 to "1". The second operation is performed. When the second operation ends, the third operation is started. When data is read from a cell corresponding to an address smaller than the final address of the SRAM 18 by one, the MTC 23 sets the count value of the counter 42 to "0". When the ½ PLL clock has passed form the data being read, for example, in synchronization with a rising of the PLL clock, the MTC 23 sets the count value of the counter 42 to "1". The third operation is performed.

In the second operation, the address corresponding to the cell that is first latched by the FF 20 is increased by one. In the third operation, the address corresponding to the cell that is first latched by the FF 20 is reduced by one. The above-described cycle is repeated M times. By the above-described operation, the test result of the all cells when the SRAM 18 is operated at the PLL clock, that is, a high-speed clock substantially the same as that in normal operation may be acquired.

Figure 6:
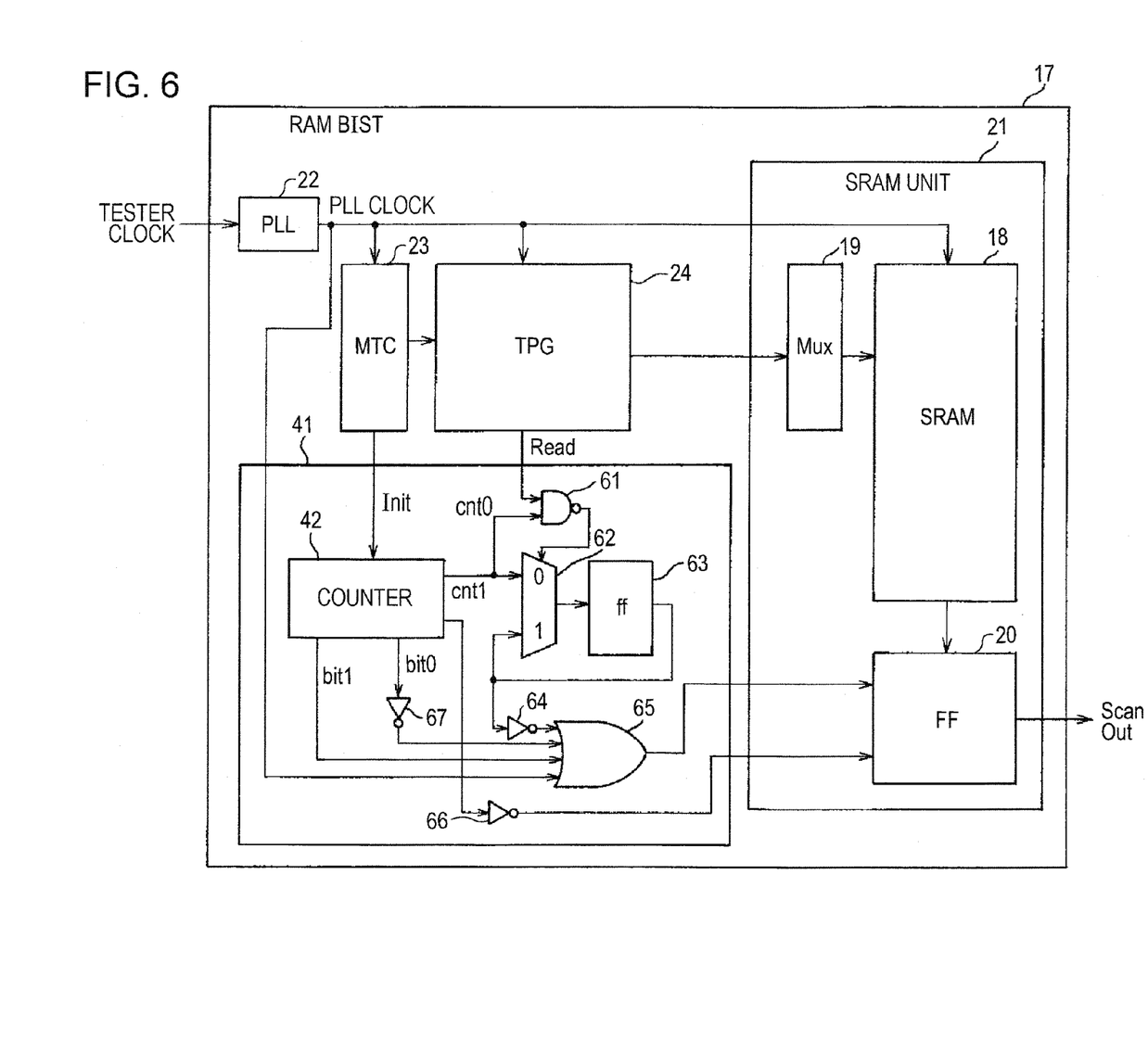
FIG. 6 illustrates an exemplary latch control circuit.
Figure 7:
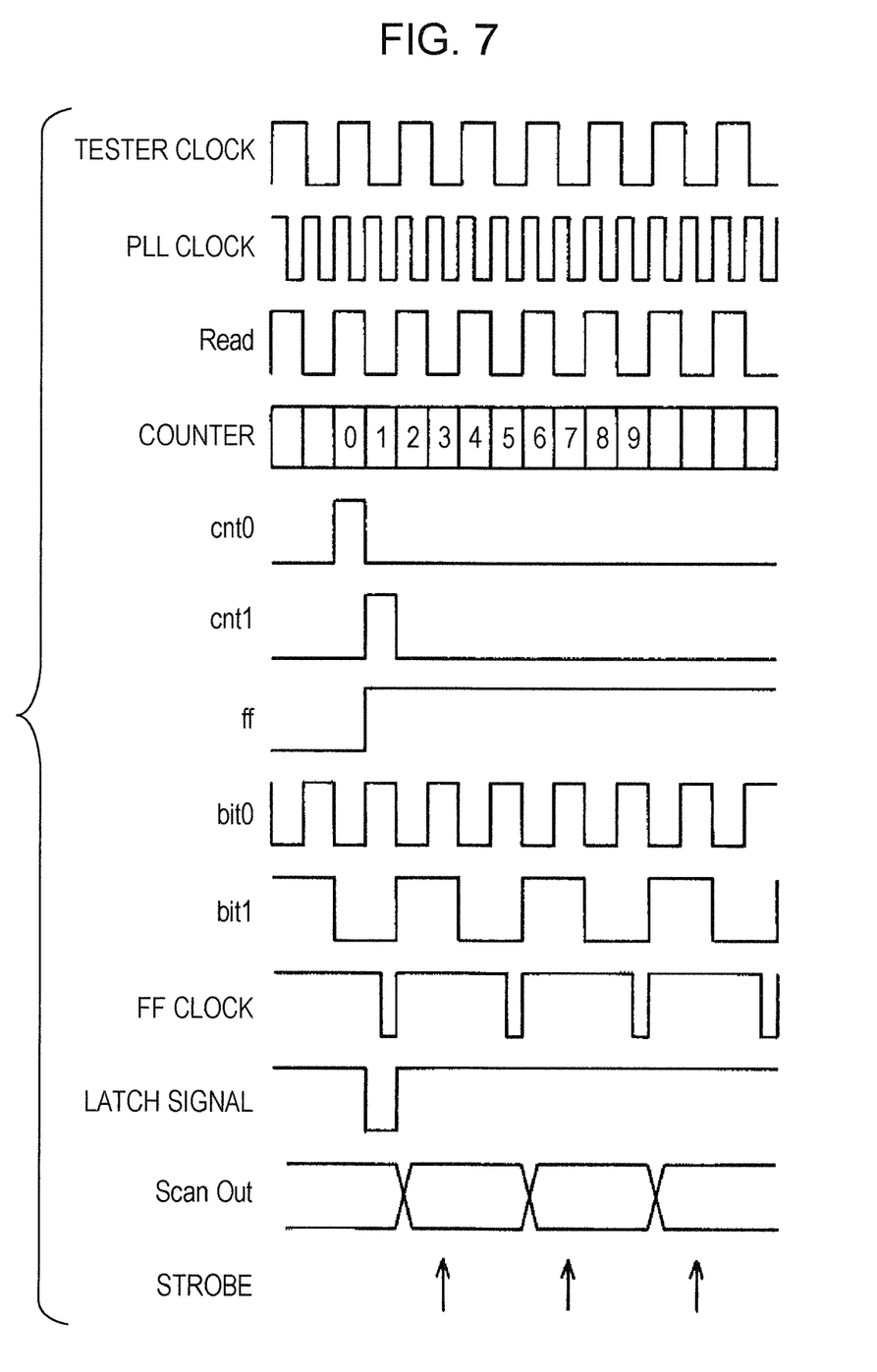
FIG. 7 illustrates an exemplary time chart of a latch control circuit.

FIG. 6 illustrates an exemplary latch control circuit. FIG. 7 illustrates an exemplary time chart of the operation of the latch control circuit illustrated in FIG. 6. For example, the SRAM 18 has output of four bits (N=4). For example, the cycle of the test clock is twice of that of the PLL clock, and the maximum count value (M−1) of the counter 42 may be 17.

The latch control circuit 41 includes the counter 42 that repeats counting from zero to seventeen, a NAND gate 61, a selector 62, a flip-flop (ff) 63, an inverter 64, a four-input OR gate 65 and inverters 66 and 67.

The value of the counter 42 is set at a given timing based on a control signal Init of the MTC 23. The counter 42 changes the count value in synchronization with a rising of the PLL clock. Two low-order bits of the count value are bit0 and bit1. The counter 42 outputs control signals cnt0 and cnt1 based on the count value. The value of the signal cnt0 may be "1" when the count value is "0", and when the count value is not "0", the value of the signal cnt0 is zero. The value of the signal cnt1 is "1" when the count value is "1", and when the count value is not "1", the value of the signal cnt1 is "0". The selector 62 selects the signal cnt0 and sets the ff 62 to "1" when both of read signals read and cnt0 from the TPG 24 are "1". After the operation, the selector 62 selects output of the ff 63 and maintains output of the ff 63 to be "1" until the count value becomes "0". When a cell corresponding to an address is read, the output of the FF 63 indicates a period in which the read data is output to the outside.

The OR gate 64 generates an FF clock. The FF clock has a value "0" when inversed bit0 and bit1 and the PLL clock is "0" in a period in which the output of the ff 63 is "1", and is "1" otherwise. The FF clock may be a pulse that has a value "0" when the count value is "0", "4", "8", . . . . The latch signal is an inverse signal of the signal cnt1.

The FF 20 latches data of a cell output from the SRAM 18 in response to a falling of the latch signal. The latched four-bit data is shifted in response to a rising of the FF clock, and output to the outside as Scan Out. The tester strobes the output Scan Out.

Figure 8:
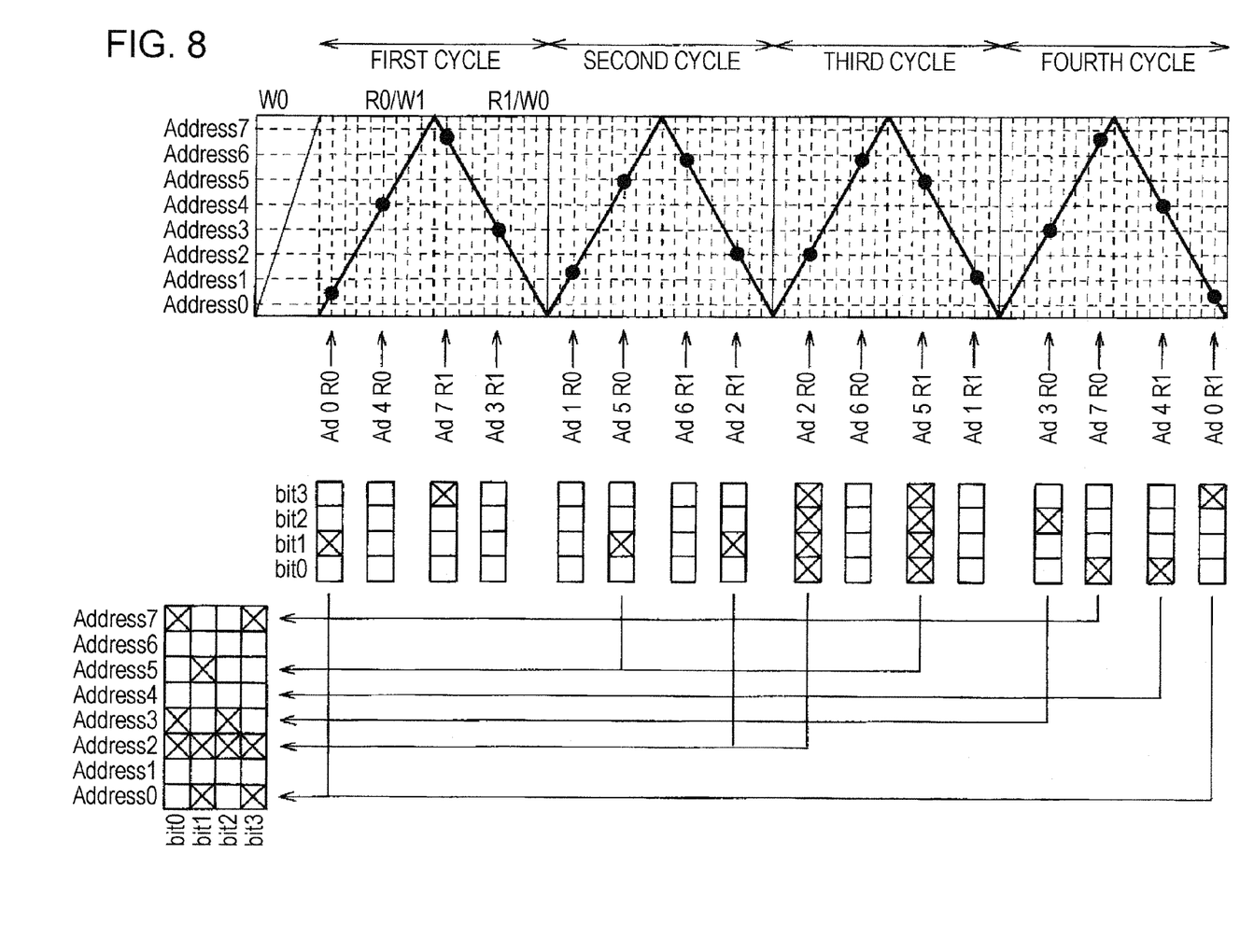
FIG. 8 illustrates an exemplary operation in an FBM acquisition test using a march pattern.

FIG. 8 illustrates an exemplary operation in an FBM acquisition test using a march pattern. The SRAM 18 includes, for example, eight cells corresponding to Address 0 to Address 7.

In the first operation, "0" is written in all of the cells.

In the second operation in the first cycle, data is read from the cells corresponding to from the address Address 0 to the address Address 7, and "1" is written in the corresponding cells. While in operation, the data read from the cells corresponding to the address Address 0 and the address Address 4 is output to the outside as Scan Out. The data read from the cell corresponding to the address Address 0 is output to the outside by the time a read operation from the cell corresponding to the address Address 4 is started. The data read from the cell corresponding to the address Address 4 is output by the time a read operation from the cell corresponding to the address Address 7 is started. In the third operation in the first cycle, data is read from the cells corresponding to addresses from the address Address 7 to the address Address 0, and "0" is written in the corresponding cells. While in operation, the data read from the cells corresponding to the address Address 7 and the address Address 3 is output to the outside as Scan Out. The data read from the cell corresponding to the address Address 7 is output to the outside by the time when a read operation from the cell corresponding to the address Address 3 is started. The data read from the cell corresponding to the address Address 3 is output to the outside by the time when a read operation from the cell corresponding to the address Address 1 is started in the second operation in the second cycle.

In the second cycle to the fourth cycle, addresses of cells from which data is read to the outside are shifted, and an operation substantially similar to that in the first cycle is performed. For example, in the second operation in the second cycle, data of the cells corresponding to the address Address 1 and the address Address 5 is output to the outside. In the third operation in the second cycle, data of the cells corresponding to the address Address 6 and the address Address 2 is output to the outside. In the second operation in the third cycle, data of the cells corresponding to the address Address 2 and the address Address 6 is output to the outside. In the third operation in the third cycle, data of the cells corresponding to the address Address 5 and the address Address 1 is output to the outside. In the second operation in the fourth cycle, data of the cells corresponding to the address Address 3 and the address Address 7 is output to the outside. In the third operation in the fourth cycle, data of the cells corresponding to the address Address 4 and the address Address 0 is output to the outside.

In the four cycles, the data is read from all of the cells. In the first embodiment, each of the cycles is sequentially performed. However the first operation, for example, the operation to write "0" in all cells may be provided between each cycle.

Figure 9:
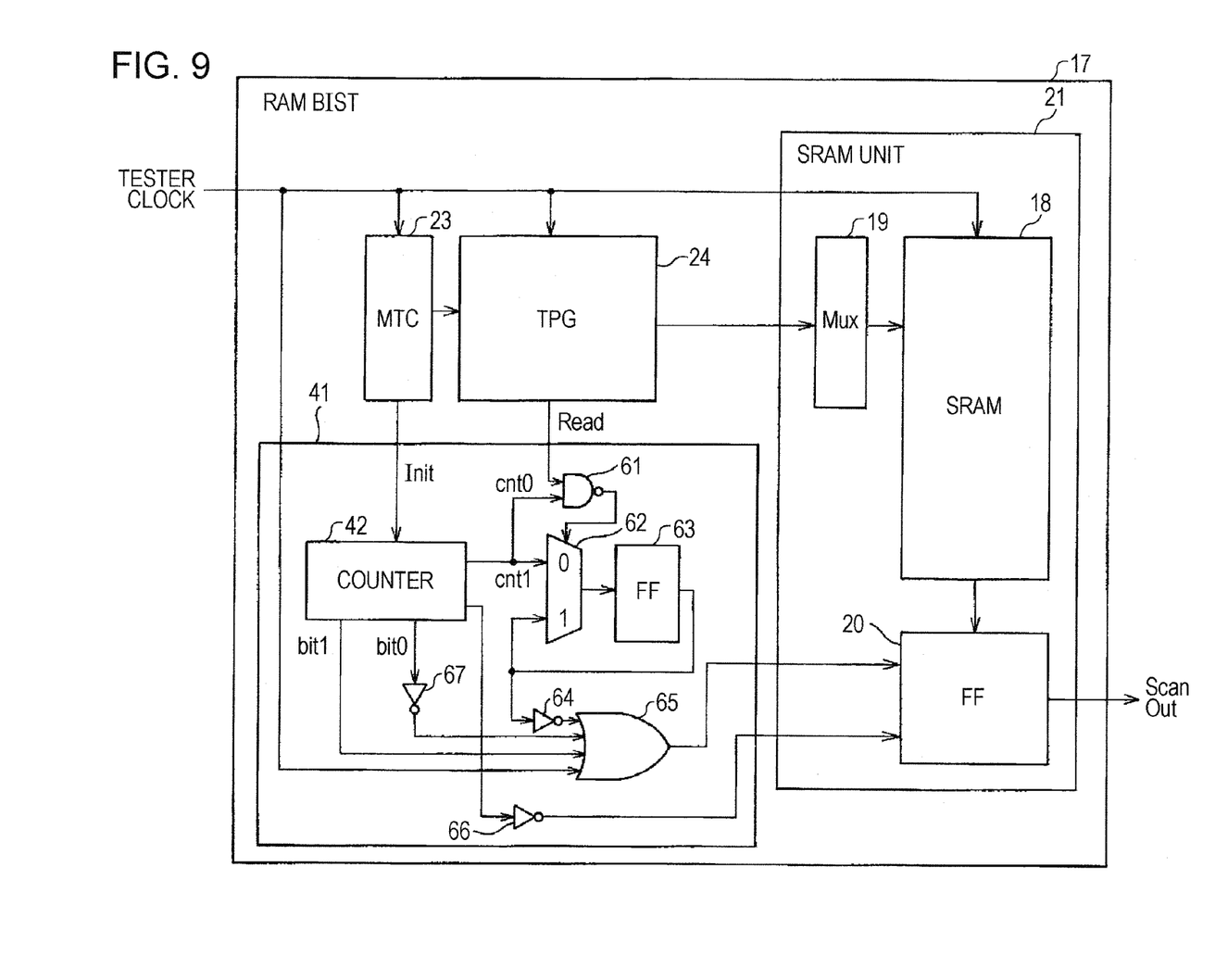
FIG. 9 illustrates a second embodiment.

FIG. 9 illustrates a second embodiment. An integrated circuit including the memory 17 in the second embodiment is, for example, a SoC having a computer system. Similarly to the memory in the first embodiment, the memory 17 in the second embodiment is accessed from a CPU, a logical circuit, or a DSP in the SoC.

Different from the first embodiment, the integrated circuit in the second embodiment does not include the PLL circuit in the RAM-BIST circuit in the memory 17. The memory 17 in the second embodiment includes the SRAM unit 21 having the SRAM 18, and the RAM-BIST circuit for performing a test of the SRAM 18. The SRAM unit 21 includes the SRAM 18, the multiplexer Mux 19 and the latch circuit (FF) 20. The RAM-BIST circuit includes the memory test controller (MTC) 23, the test pattern generation circuit (TPG) 24, and the latch control circuit 41. A configuration of the latch control circuit 41 may be substantially the same as or similar to that of the latch control circuit in the first embodiment.

In the second embodiment, an externally supplied high-speed tester clock is directly supplied to the SRAM unit 21, the MTC 23, the TPG 24, or the like. The SRAM 18 operates in synchronization with the tester clock. The memory in the first embodiment operates in synchronization with the PLL clock. However, the memory in the second embodiment operates in synchronization with the tester clock.

Figure 10:
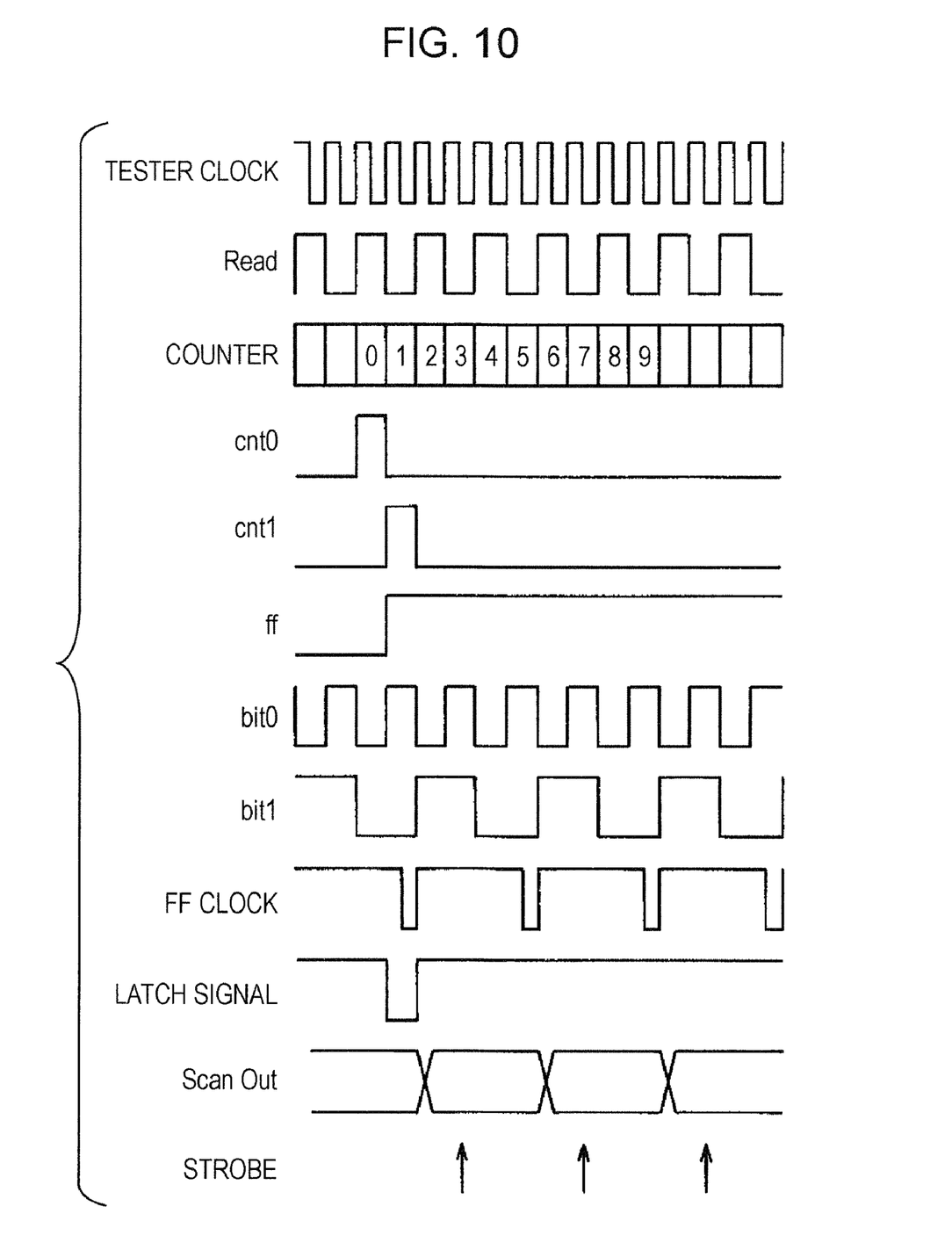
FIG. 10 illustrates an exemplary time chart of a built-in self-test (BIST) circuit.

FIG. 10 illustrates an exemplary time chart of the operation of the circuit illustrated in FIG. 9. As compared with the time chart illustrated in FIG. 7, in the time chart illustrated in FIG. 10, the tester clock is used in place of the PLL clock. The other parts illustrated in FIG. 10 are substantially the same as or similar to those illustrated in FIG. 7.

Figure 11:
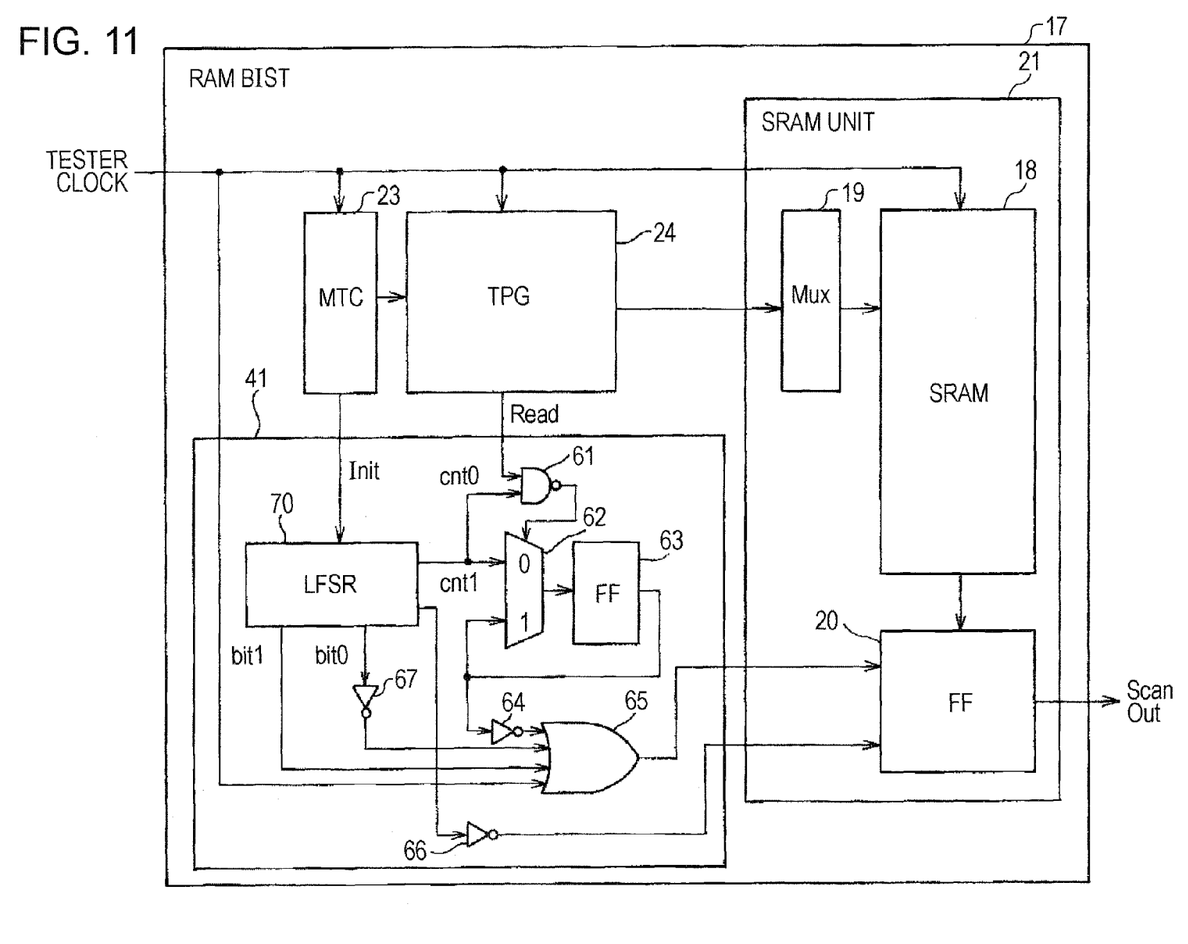
FIG. 11 illustrates a third embodiment.

FIG. 11 illustrates a third embodiment. An integrated circuit including the memory 17 in the third embodiment is, for example, a SoC having a computer system. Similarly to the memory in the second embodiment, the memory 17 is accessed from a CPU, a logical circuit, or a DSP in the SoC.

Different from the second embodiment, in the third embodiment, a linear feedback shift register (LFSR) 70 is used as the counter in the latch control circuit in the RAM-BIST circuit. The other parts in the third embodiment are substantially the same as or similar to those in the second embodiment.

The linear feedback shift register generates a random number sequence of a relatively long cycle. For example, the linear feedback shift register discussed in Japanese Laid-open Patent Publication No. H10-207695 may be used.

Except for the point that the linear feedback shift register is used, the third embodiment is substantially the same as or similar to the second embodiment.

In the embodiments, an FBM indicating an address of a faulty cell when the integrated circuit operates at an actual operation speed, for example, when the integrated circuit at-speed operates is acquired. For example, an FBM in normal operation is acquired in a time period substantially the same as the time required for acquiring the FBM in low-speed operation.

In the FBM acquisition test according to the embodiments, the march pattern is used. However, any other patterns may be used.

In the quality determination test according to the embodiments, the FF that holds the data R0 and R1 is used. However, in the quality determination test or the FBM acquisition test, an FF that has one flip-flop may be used.

In the embodiments, the SRAM is used. However, any other writable memories may be used.

In the embodiments, the SoC is used. However, any other integrated circuits including a memory that is not externally accessible may be used.

Example embodiments of the present invention have now been described in accordance with the above advantages. It will be appreciated that these examples are merely illustrative of the invention. Many variations and modifications will be apparent to those skilled in the art.

What is claimed is:

1. An integrated circuit comprising:
   a memory;
   a memory test circuit that tests the memory; and
   an input/output port,
   wherein the memory test circuit includes a latch circuit that latches output of the memory,
   an address of the memory to be accessed is changed in accordance with a first clock signal, and the output of the memory corresponding to the changed address is latched in accordance with a latch signal having a cycle of an integral multiple of the first clock signal,
   data of the latch circuit is output via the input/output port in a cycle of the latch signal,
   an address of a memory cell corresponding to the output of the memory to be latched by the latch circuit is changed, and the latch and the output is repeated.

2. The integrated circuit according to claim 1, further comprising a circuit that communicates with an outside element via the input/output port and accesses the memory,
   wherein the memory is accessible via the circuit.

3. The integrated circuit according to claim 1, wherein the memory test circuit includes a counter that generates the latch signal based on the first clock signal.

4. The integrated circuit according to claim 3, wherein the counter is a linear feedback shift register.

5. The integrated circuit according to claim 1, wherein the memory test circuit includes a PLL circuit that generates the first clock signal based on a test clock signal slower than the first clock signal.

6. The integrated circuit according to claim 1, wherein the address of the memory is changed such that all memory cells are accessed in accordance with the first clock signal, and output of the all memory cells is output to an outside.

7. The integrated circuit according to claim 1, further comprising a comparison circuit that compares write data written in the memory with output of the memory corresponding to the write data.

8. A test method for testing a memory in an integrated circuit, the memory not being directly externally accessible, the method comprising:
   changing an address of the memory to be accessed in accordance with a first clock signal,
   latching the output of the accessed memory in accordance with a latch signal having a cycle of an integral multiple of the first clock signal,
   outputting the latched data via an input/output port in a cycle of the latch signal, and
   changing an address of a memory cell corresponding to the output of the memory to be latched, and repeating the latch and the output.

9. The test method according to claim 8, wherein the integrated circuit comprises a circuit that communicates with an outside element via the input/output port and accesses the memory, and
   wherein the memory is accessible via the circuit.

10. The test method according to claim 8, further comprising generating the latch signal by frequency-dividing the first clock signal.

11. The test method according to claim 8, further comprising generating the first clock signal based on a test clock signal that is externally supplied and slower than the first clock signal.

12. The test method according to claim 8, further comprising comparing write data written in the memory with output of the memory corresponding to the write data.

13. The test method according to claim 8, further comprises:
   changing the address of the memory such that all memory cells are accessed in accordance with the first clock signal; and
   outputting the output of the all memory cells to the outside.

* * * * *

UNITED STATES PATENT AND TRADEMARK OFFICE
CERTIFICATE OF CORRECTION

PATENT NO. : 8,081,528 B2  
APPLICATION NO. : 12/482254  
DATED : December 20, 2011  
INVENTOR(S) : Takahisa Hiraide Page 1 of 1

It is certified that error appears in the above-identified patent and that said Letters Patent is hereby corrected as shown below:

On the Title Page:

Item (30), should read:

<u>Aug. 1</u>, 2008   (JP)...................2008-200094

Signed and Sealed this
Twentieth Day of March, 2012

David J. Kappos
*Director of the United States Patent and Trademark Office*